United States Patent
Borthakur et al.

(10) Patent No.: US 9,930,281 B2
(45) Date of Patent: Mar. 27, 2018

(54) IMAGE SENSORS HAVING PHOTODIODE REGIONS IMPLANTED FROM MULTIPLE SIDES OF A SUBSTRATE

(71) Applicant: SEMICONDUCTOR COMPONENTS INDUSTRIES, LLC, Phoenix, AZ (US)

(72) Inventors: Swarnal Borthakur, Boise, ID (US); Ulrich Boettiger, Garden City, ID (US); Richard A. Mauritzson, Meridian, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 32 days.

(21) Appl. No.: 15/155,742

(22) Filed: May 16, 2016

(65) Prior Publication Data
US 2017/0208277 A1 Jul. 20, 2017

Related U.S. Application Data

(60) Provisional application No. 62/280,981, filed on Jan. 20, 2016.

(51) Int. Cl.
*H04N 5/378* (2011.01)
*H01L 27/146* (2006.01)

(52) U.S. Cl.
CPC ....... *H04N 5/378* (2013.01); *H01L 27/14621* (2013.01); *H01L 27/14636* (2013.01); *H01L 27/14643* (2013.01); *H01L 27/14698* (2013.01)

(58) Field of Classification Search
CPC .......... H01L 27/14643; H01L 27/1464; H01L 27/14603; H01L 27/14636; H04N 5/378
See application file for complete search history.

(56) References Cited

U.S. PATENT DOCUMENTS

| | | | |
|---|---|---|---|
| 6,465,786 B1 | 10/2002 | Rhodes | |
| 7,112,465 B2 | 9/2006 | Gouscha et al. | |
| 7,402,479 B2 | 7/2008 | Lim | |
| 8,664,734 B2 | 3/2014 | Wu et al. | |
| 8,933,494 B1 | 1/2015 | Hu et al. | |
| 2009/0200580 A1 | 8/2009 | Rhodes et al. | |

(Continued)

*Primary Examiner* — Ahmed A Berhan
(74) *Attorney, Agent, or Firm* — Treyz Law Group, P.C.; Michael H. Lyons; David K. Cole (57) ABSTRACT

An image sensor with an array of pixels is provided. The array may include a semiconductor substrate having opposing first and second sides. A first photodiode region may be implanted in the semiconductor substrate through the first side. A second photodiode region may be implanted in the semiconductor substrate through the second side. The second photodiode region may be implanted to overlap with the first photodiode region in the semiconductor substrate to form a continuous photodiode region that extends from the first side to the second side of the substrate. The continuous region may generate charge in response to image light. The continuous region may belong to a single pixel that generates an image signal from the charge. The image signal may be conveyed to readout circuitry via metallization layers formed over the substrate. The first and second photodiode regions may be thermally activated prior to forming the metallization layers.

18 Claims, 11 Drawing Sheets

(56) References Cited

U.S. PATENT DOCUMENTS

2013/0015513 A1* 1/2013 Kido .................. H01L 27/1461
　　　　　　　　　　　　　　　　　　　　　　257/292
2013/0113969 A1* 5/2013 Manabe ............. H01L 27/1461
　　　　　　　　　　　　　　　　　　　　　　348/308
2015/0311240 A1　10/2015 Cohen et al.

* cited by examiner

IMAGE SENSORS HAVING PHOTODIODE REGIONS IMPLANTED FROM MULTIPLE SIDES OF A SUBSTRATE

CROSS-REFERENCE TO RELATED APPLICATION(S)

This application claims priority to U.S. Provisional Application No. 62/280,981, filed on Jan. 20, 2016, entitled "Image Sensors Having Photodiode Regions Implanted from Multiple Sides of a Substrate," invented by Swarnal Borthakur, Ulrich Boettiger and Richard A. Mauritzson, and is incorporated herein by reference and priority thereto for common subject matter is hereby claimed.

BACKGROUND

This relates generally to image sensors and, more specifically, to image sensors having photodiode regions implanted from both sides of a semiconductor substrate.

Modern electronic devices such cellular telephones, cameras, and computers often use digital image sensors. Imagers (i.e., image sensors) include a two-dimensional array of image sensing pixels. Each pixel includes a photosensor such as a photodiode that receives incident photons (light) and converts the photons into electrical charges. The photodiodes in the array are implanted in a silicon substrate.

In conventional image sensors, the photodiodes are implanted in the silicon substrate through a single surface of the substrate using pattern-implant equipment. After implantation, the silicon substrate is thermally heated to activate the implant dopants. In general, it is desirable to implant the photodiodes at greater depths below the surface of the substrate to increase the light collection efficiency of the sensor. However, implanting the photodiodes through a single surface of the substrate to great depths requires high energy. High energy implants require very thick resist or other dense masks to prevent ions leaking through the masks. This is exacerbated with finer dimensions. In addition, if the mask is excessively thick, to accommodate deep implants, shadowing effects will occur. Such limitations on the depth of the photodiode implants undesirably limit the light collection efficiency of the image sensor.

It would therefore be desirable to be able to provide improved image sensors.

DETAILED DESCRIPTION

Embodiments of the present invention relate to image sensors, and more specifically, to image sensors having photodiodes that are implanted from multiple sides of a semiconductor substrate. It will be recognized by one skilled in the art, that the present exemplary embodiments may be practiced without some or all of these specific details. In other instances, well-known operations have not been described in detail in order not to unnecessarily obscure the present embodiments.

Electronic devices such as digital cameras, computers, cellular telephones, and other electronic devices may include image sensors that gather incoming light to capture an image. The image sensors may include arrays of image sensor pixels (sometimes referred to herein as image pixels or pixels). The pixels in the image sensors may include photosensitive elements such as photodiodes that convert the incoming light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the image pixels and readout circuitry for reading out image signals corresponding to the electric charge generated by the photosensitive elements.

Figure 1:
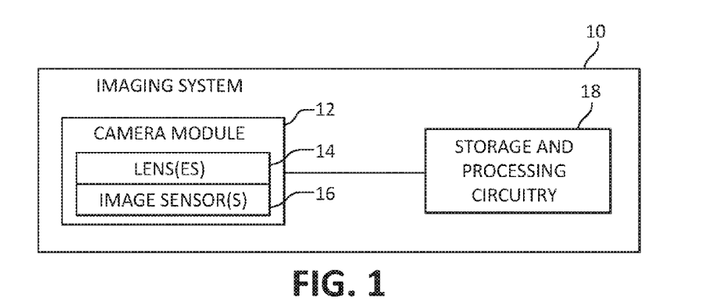
FIG. 1 is a diagram of an illustrative electronic device in accordance with an embodiment.

FIG. 1 is a diagram of an illustrative electronic device that uses an image sensor to capture images. Imaging system 10 of FIG. 1 may be a portable imaging system such as a camera, a cellular telephone, a video camera, or other imaging device that captures digital image data. Camera module 12 may be used to convert incoming light into digital image data. Camera module 12 may include a lens 14 and a corresponding image sensor 16. Lens 14 and image sensor 16 may be mounted in a common package and may provide image data to storage and processing circuitry 18. In some embodiments lens 14 may be part of an array of lenses and image sensor 16 may be part of an image sensor array.

Storage and processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensor 16 or an integrated circuit within module 12 that is associated with image sensor 16). Image data that has been captured and processed by camera module 12 may, if desired, be further processed and stored using storage and processing circuitry 18. Processed image data may, if desired, be provided to external equipment (e.g., a computer or other device) using wired and/or wireless communications paths coupled to storage and processing circuitry 18.

Image sensor 16 may be configured to receive light of a given color by providing the image sensor with a color filter. The color filters that are used for image sensor pixel arrays in the image sensor may, for example, be red filters, blue filters, and green filters. Each filter may form a color filter layer that covers the image sensor pixel array of the image sensor. Other filters such as white color filters, yellow color filters, dual-band IR cutoff filters (e.g., filters that allow visible light and a range of infrared light emitted by LED lights), etc. may also be used.

An image sensor (e.g., image sensor 16 in FIG. 1) may include image sensor pixels arranged in an image pixel array. Each pixel in the array may include a photodiode implanted in a silicon substrate. In general, it may be desirable to implant photodiodes deeper within the substrate to improve the light collection efficiency of the image sensor, particularly at longer wavelengths. In some scenarios, the photodiodes are implanted within the silicon substrate through only one of a top or bottom surface of the substrate.

However, implanting the photodiodes through a single surface of the substrate can limit the depth within the substrate at which the photodiodes are formed. This is because pattern-implant equipment that performs the implantation of the photodiodes forms implant regions that are limited by the interaction of the implant mask and the implant energy. High energy implants require dense resist or other (e.g., oxide, nitride, etc.) dense masks to prevent ions leaking through the masks. This is exacerbated with finer dimensions. In addition, if the mask is excessively thick, to accommodate deep implants, ion shadowing effects will occur. With dimensions such as 0.2-0.3 μm as utilized in many image sensors, achieving aspect ratios of greater than 10:1 (e.g., a ten to one ratio of resist mask thickness to feature line or space) is desirable, but difficult to achieve in practice. Such implantation sets an effective limit on the total depth of the photodiode implants of approximately 3 micrometers relative to the surface of the substrate.

Figure 2:
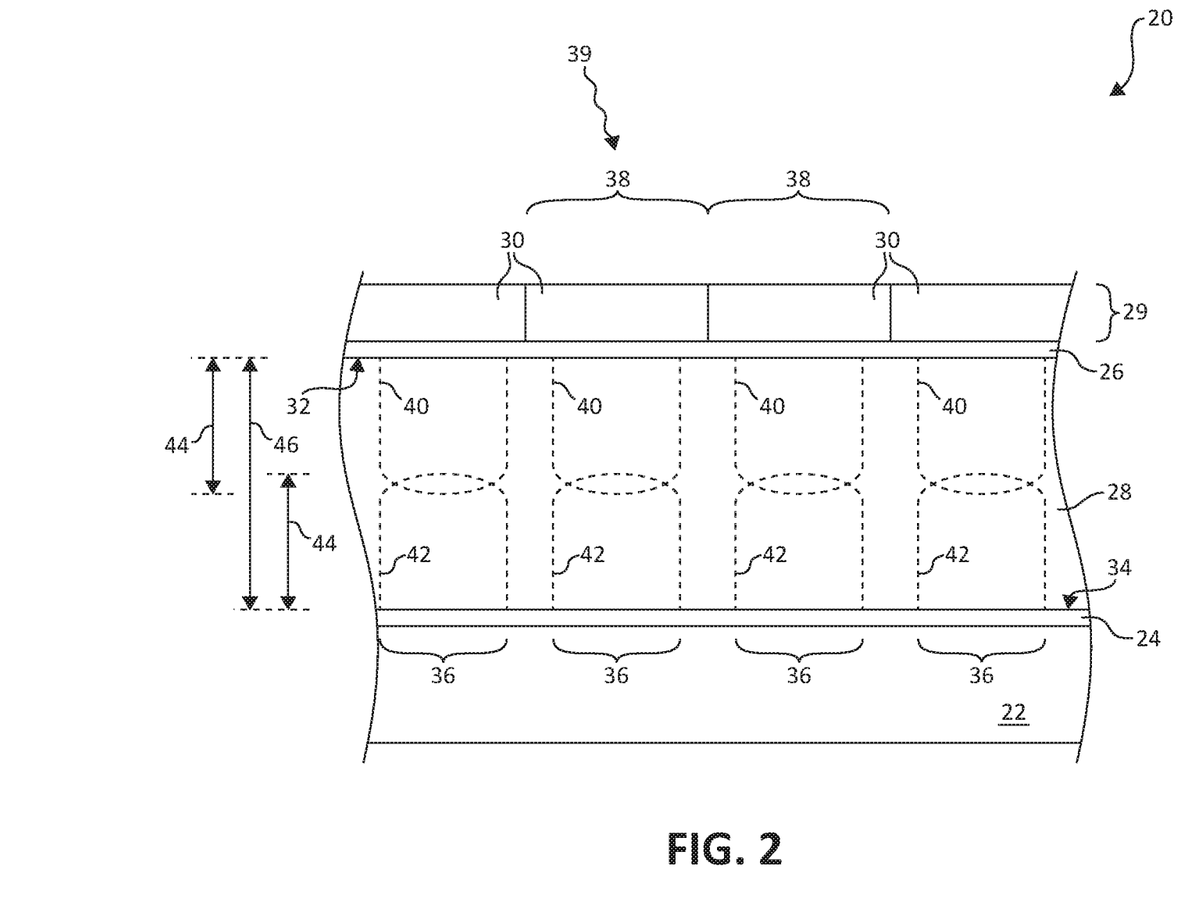
FIG. 2 is a diagram of an illustrative image sensor pixel array having photodiode regions implanted through opposing sides of a semiconductor substrate in accordance with an embodiment.

If desired, the effective depth of the photodiodes in the substrate may be increased relative to scenarios where the photodiodes are implanted from only a single surface of the substrate by implanting the photodiodes from both the top and bottom surfaces of the substrate. FIG. 2 is a cross-sectional diagram of an image pixel array having photodiodes implanted from both top and bottom surfaces of the semiconductor substrate.

As shown in FIG. 2, image sensor 16 may include an image sensor pixel array 20. Pixel array 20 may be formed using a semiconductor substrate. Array 20 may include a doped semiconductor layer 28. Interconnect layer 24 (also known as metallization layers 24) may be formed under bottom surface 34 of layer 28. Metallization layers 24 may have metal and dielectric regions that are used to route signals (e.g., pixel control signals, pixel output signals, etc.) on pixel array 20. Pixel array 20 may include a semiconductor carrier layer 22 formed under metallization layers 24. Layer 22 may be, for example, a silicon layer, other semiconductor wafer substrate, or carrier wafer. Passivation layer 26 may be formed over top surface 32 of semiconductor layer 28. Color filter array 29 may be formed over passivation layer 26. Passivation layer 26 may include dielectric or other materials that isolate color filter array 29 from layer 28.

Array 20 may receive image light 39 through color filter array 29. Color filter array 29 may include multiple color filter elements 30. Each color filter element 30 may pass light of a corresponding color (e.g., may filter incoming light 39 by wavelength). For example, green color filter elements 30 pass green light, red elements 30 pass red light, yellow filter elements 30 pass yellow light, infrared filter elements 30 pass infrared light, etc. Each color filter element 30 may be formed over a corresponding image pixel 38 in array 20. Image pixels 38 may include a corresponding photodiode region 36. Photodiode region 36 may generate charge in response to image light 39. The generated charge may be converted into an image signal (image voltage) and may be read out by control circuitry in image sensor 16 (e.g., via metallization layers 24 and corresponding readout lines).

The photodiode region 36 in each image pixel 38 may include first and second photodiode implant regions. As shown in FIG. 2, a given image pixel 38 includes a first photodiode implant 40 that is implanted through top surface 32 and a second photodiode implant 42 that is implanted through bottom surface 34. Implants 40 and 42 may, for example, be implanted by chip/wafer fabrication equipment (e.g., pattern implantation equipment) or other manufacturing equipment in a manufacturing system that assembles arrays 20. Photodiode implants 40 may extend to a depth 44 from top surface 32 whereas implants 42 extend to a depth 44 from bottom surface 34. As one example, the depth of implants 42 may be similar to the depth of implants 40. Photodiode implants 40 and 42 may be, for example n-type doped implants. If desired, the regions in layer 28 formed between photodiodes 36 may include p-type doped isolation implants. In another suitable arrangement, photodiode implants 40 and 42 are p-type doped implants and the regions in substrate 28 are n-type doped isolation implants.

Implants 40 and 42 in layer 28 may overlap such that the implants form a continuous photodiode region 36 in the corresponding pixel 38. Continuous photodiode region 36 may contact surfaces 34 and/or 32 or may approach the surfaces without contacting the surfaces. If desired, the continuous photodiode region may extend to within less than or equal to 0.5 microns of surfaces 32 and/or 34 (e.g., the continuous region may contact surface 32 and/or 34, may extend to within 0.5 microns of surfaces 32 and/or 34, may extend to within 0.3 microns of surfaces 32 and/or 34, etc.). Photodiode region 36 may have an effective depth 46 that is greater than depth 44 of a single photodiode implant. Effective depth 46 may extend substantially from top surface 32 to bottom surface 34. It is also typically desired to have a shallow p-doped region at the top and bottom surface, 32 and 34 respectively, to create a pinned photodiode and/or reduce dark current. As an example, implant depth 44 may be 2-3 micrometers whereas photodiode depth 46 is 4-6 micrometers. By forming two different overlapping photodiode implants from both sides of layer 28, the depth of photodiode region 36 may be effectively extended even though the corresponding implantation equipment is only capable of implanted photodiode regions to a shallower depth of 2-3 micrometers (e.g., due to limitations associated with the implant resist and masking technology).

During fabrication of array 20, photodiode implants 44 and 42 may be thermally activated prior to forming metallization layer 24 to minimize the risk of thermal damage to layer 24 associated with thermal activation. Because photodiode regions 36 have a greater effective depth in substrate layer 28 than implants 40 or implants 42 on their own, the light collecting efficiency of regions 36 may be greater than that of a single side of implants 40 or 42, particularly at longer wavelengths (e.g., because photodiodes 36 may generate charge in response to image light 39 across their entire length 46).

In the example shown in FIG. 2, array 20 is arranged as a back-side-illuminated (BSI) image sensor pixel array. In a BSI array, light 39 is received through the top (back) side 32 of layer 28 whereas metallization layers 24 are formed on the bottom (front) side 34 of layer 28. This example is merely illustrative. If desired, array 20 may be a front-side-illuminated (FSI) array. In a FSI array, color filter layer 29 is formed over metallization layer 24 (or layer 22) and image light 39 is received at substrate 28 through metallization layer 24. If desired, some of the pixels 38 in array 20 may be formed without a second photodiode implant 42 at front side 34. In scenarios where array 20 is an FSI array, some of pixels 38 may be formed without implant 40 at back side 32.

Figure 3:
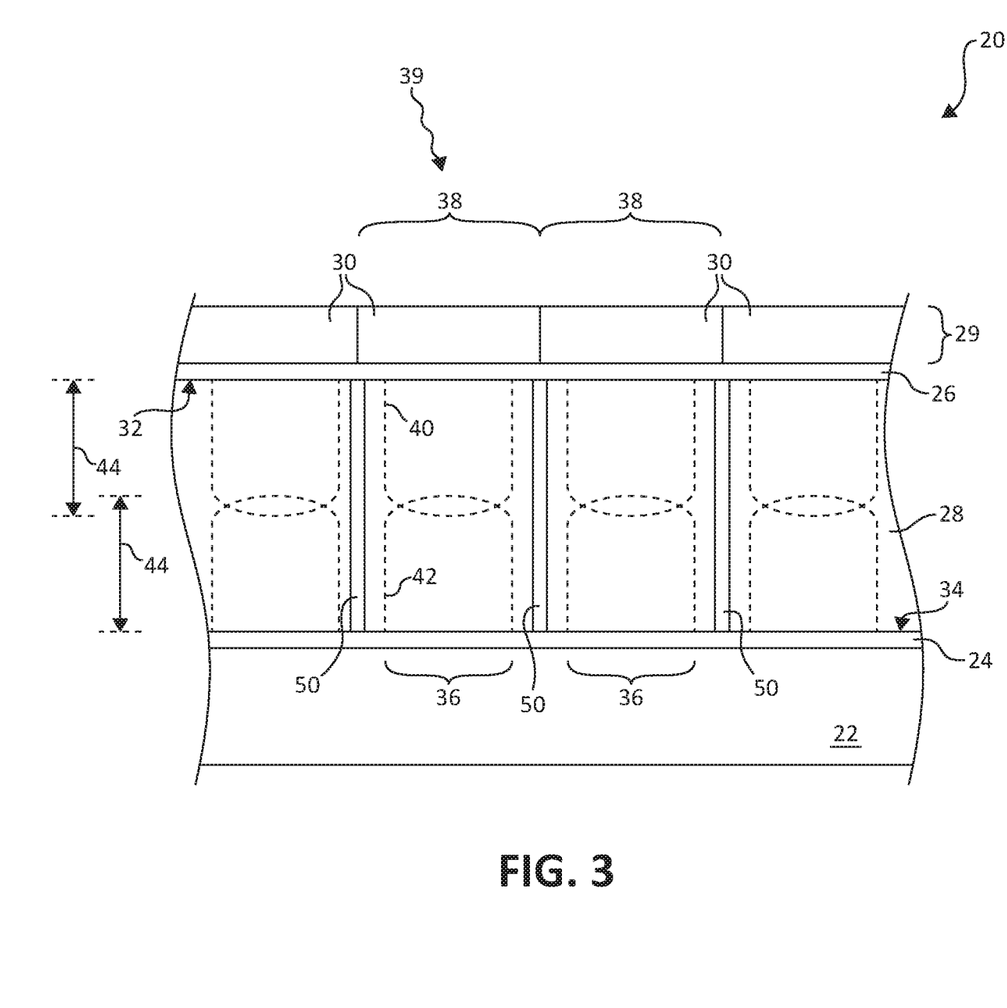
FIG. 3 is a diagram of an illustrative image sensor pixel array having photodiode regions implanted from opposing sides of a semiconductor substrate and having deep trench isolation structures in accordance with an embodiment.

If desired, array 20 may include isolation structures such as deep trench isolation structures formed between adjacent image pixels 38. FIG. 3 is an illustrative diagram showing how trench isolation structures may be formed in array 20. As shown in FIG. 3, isolation trenches 50 may be formed between adjacent pairs of photodiode regions 36. Trenches 50 may penetrate into substrate 28. Trenches 50 may be deeper than depth 44 of a single photodiode implant 40 or 42. For example, trenches 50 may extend from top surface 32 to bottom surface 34 of substrate layer 28. This is merely illustrative and, if desired, trenches 50 may extend across part of the thickness of layer 28 or may include two different trenches that each extend from the top and bottom surfaces respectively.

Isolation trenches 50 may be filled with material that enhances the optical and/or electrical isolation between adjacent photodiodes 36. For example, isolation trenches 50 may be filled with an un-doped oxide, p+ doped oxide (e.g., boron doped glass), p+ doped polysilicon (e.g., boron doped polysilicon), p+ doped polysilicon having a liner (e.g., a phosphorous doped oxide liner) interposed between the polysilicon and sidewalls and floors of trenches 50, a refractory metal (e.g., tungsten, molybdenum or other metals having a resistance to high heat, corrosion and wear) having a p+ oxide liner (e.g., boron doped oxide), or any other desired conductor, semiconductor, and/or dielectric isolation materials. Filled isolation trenches 50 may serve to reduce optical and/or electrical cross talk between adjacent pixels 38 and to increase quantum efficiency of the pixels. During fabrication of array 20, trenches 50 may be formed within substrate 28 from top surface 32 or bottom surface 34. Trenches 50 may, if desired, be formed prior to thermal activation of implants 40 and 42 to prevent any dopant spreading or out-diffusion during the thermal activation.

In some scenarios, pixels 38 may be configured to generate image signals in response to infrared light. Pixels 38 that generate image signals in response to infrared light are sometimes referred to herein as infrared image pixels or infrared pixels 38IR. Due to the reduced absorptivity of silicon at longer wavelengths, longer wavelength light such as infrared light will be more efficiently captured by photodiode regions 36 at greater depths in the silicon relative to visible light. If desired, the size of the photodiode regions in substrate 38 may be greater at the side opposite to the side through which infrared image light 39 is received so as to increase collection of the infrared light at greater depths in substrate 28.

Figure 4:
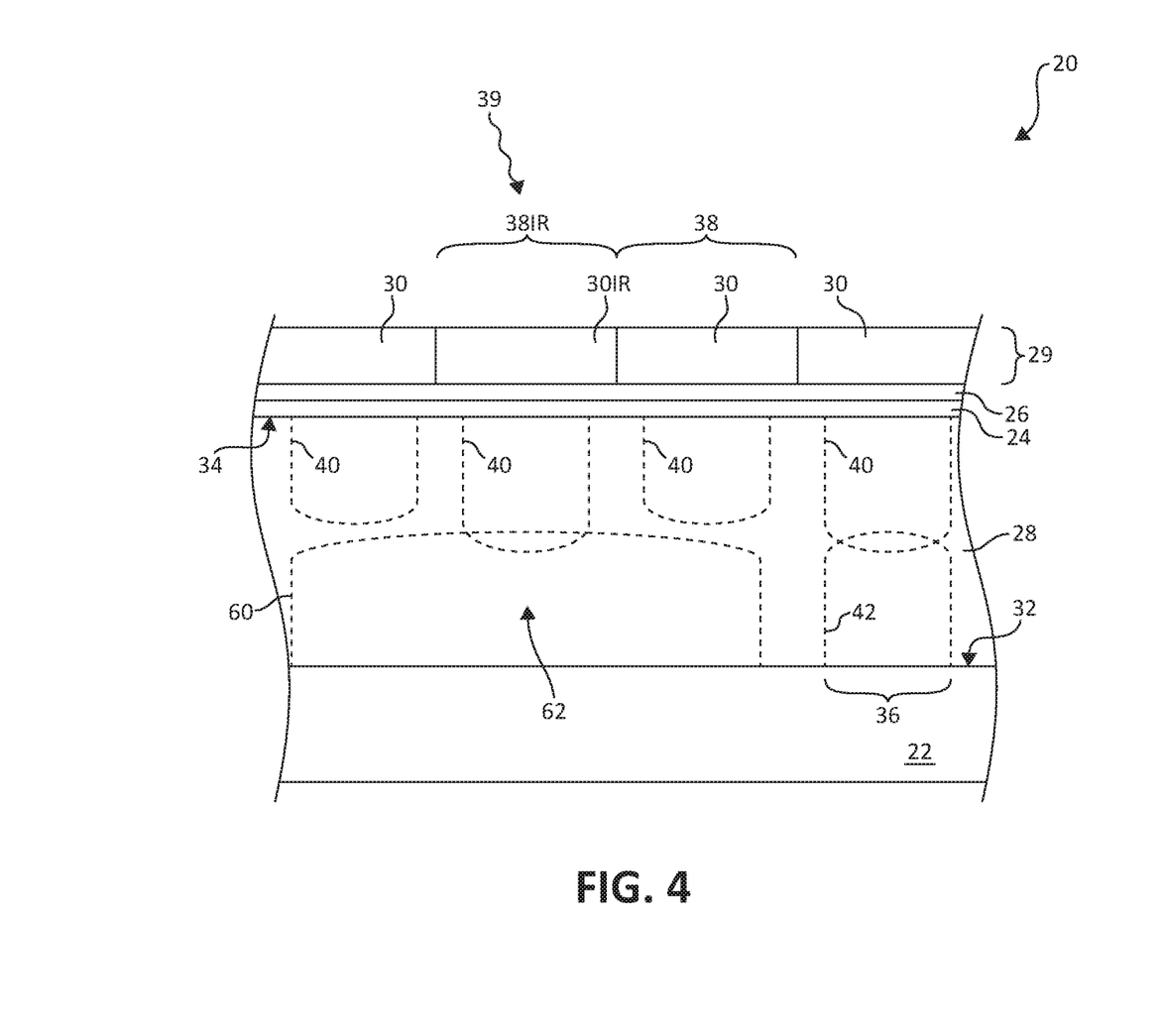
FIG. 4 is diagram of an illustrative image sensor pixel array having photodiode regions of different sizes implanted through opposing sides of a semiconductor substrate in accordance with an embodiment.

FIG. 4 is an illustrative cross-sectional diagram showing how infrared pixels in array 20 may have different sized photodiode implants at different sides of substrate 28. As shown in FIG. 4, an infrared pixel 38IR may be formed in array 20. Pixel 38IR may be provided with an infrared color filter element 30IR that transmits infrared image light 39. Array 20 in the example of FIG. 4 is a front side illuminated array in which image light 39 is received by photodiode substrate layer 28 through metallization layer 24 (e.g., metallization layer 24, passivation layer 26, and color filter array 29 are all formed on the same side of array 20). If desired, infrared pixels may be formed in a back side illuminated array such as those shown in FIGS. 2 and 3.

Referring again to FIG. 4, photodiode implants 40 may be implanted into substrate 28 through front side 34 of substrate 28 during fabrication of array 20. For non-infrared pixels 38, photodiode implants 42 may be implanted into substrate 28 through back side 32. For infrared pixels 38IR, a laterally-extended photodiode implant 60 may be formed at back side 32. Photodiode implant 60 may be doped using the same material as implants 40 and 42 (e.g., using n-type material). Infrared pixel implant 60 may extend under photodiode implants 40 of adjacent pixels 38. Implant 60 may be formed at a depth relative to back side 32 such that implant 60 does not overlap with regions 40 of adjacent pixels 38, thereby serving to isolate implant 60 from regions 40 in the adjacent pixels. Implant 60 and the implant 40 in that infrared pixel 38IR may overlap in substrate 28 to form a continuous photodiode region 62.

The increased size of implant 60 relative to adjacent implants 42 may serve to increase the light collection area of infrared pixel 38IR at greater depths from light collection side 34 than for pixels with implants 42. For example, the light collection area of implant 60 may be approximately three times that of implant 40. Each infrared pixel across array 20 may be provided with a corresponding expanded deep implant 60 or only a subset of the infrared pixels in array 20 may be provided with expanded implant 60. The example of FIG. 4 is merely illustrative. If desired, pixels of any color in array 20 may be provided with expanded deep implant 60. In general, the size of the implants at front surface 34 and back surface 32 may vary within individual pixels in array 20 and the size of the implants at back surface 32 may vary across pixels in array 20. If desired, non-infrared pixels 38 in an array having infrared pixels 38IR may be formed without back side implants 42. Implants 60 may be formed in substrate 28 at the same fabrication step as implants 42 in FIGS. 2 and 3 during fabrication of array 20. If desired, deep trench structures 50 of the type shown in FIG. 3 may be formed within the image sensor array of FIG. 4.

FIGS. 5-9 are illustrative diagrams showing an example of how image sensor array 20 of the type shown in FIGS. 2 and 3 may be fabricated in a manufacturing system. It should be noted that implanting photodiodes from the back surface during typical BSI processing requires high temperatures to activate the dopants and repair implant related silicon/crystal damage. However, at depths greater than about 1 μm, implants cannot be thermally activated without damaging (e.g. melting) already formed/existing metallization layers. The proposed manufacturing process overcomes this issue by processing the front and backside implants early in the process flow prior to metallization.

Figure 5:
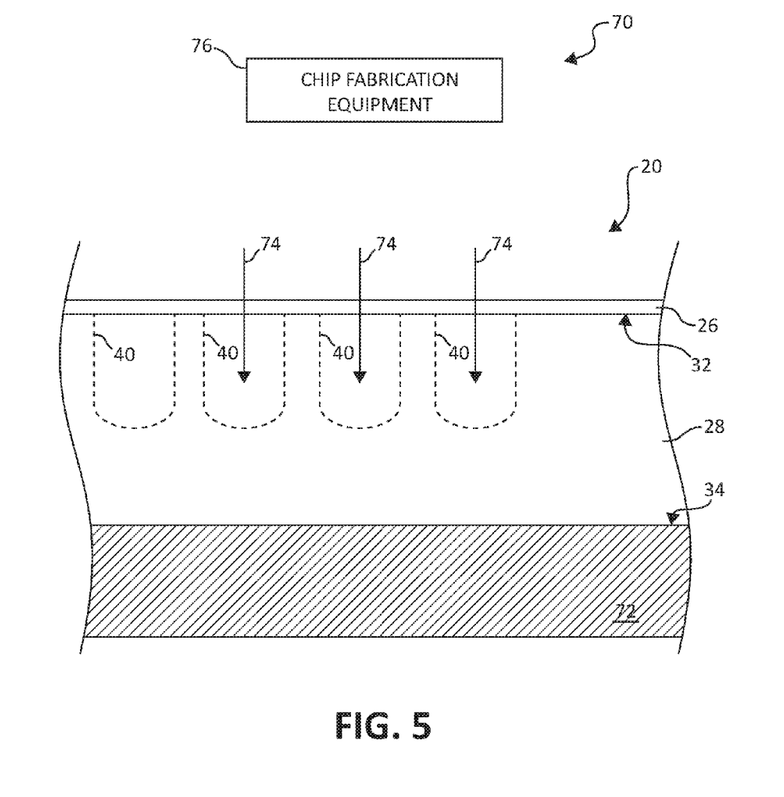
FIGS. 5-9 are diagrams showing illustrative intermediate processing stages of an illustrative image sensor having photodiode regions implanted from opposing sides of a semiconductor substrate in accordance with an embodiment.

FIG. 5 is a cross-sectional diagram showing how back side implants 40 may be implanted into image sensor array 20. As shown in FIG. 5, manufacturing system 70 may include chip or wafer fabrication equipment 76 that fabricates (assembles) image sensor array 20. A starting substrate may include an epitaxial layer 28 grown or deposited on top of sacrificial layer 72. Sacrificial layer 72 may include a silicon doped substrate. The starting substrate may also be a SOI (Silicon-On-Insulator) substrate with epitaxial layer 28 and substrate 72.

Fabrication equipment 76 may implant photodiode regions 40 through back surface 32 as shown by arrows 74. Equipment 76 may include pattern-implant equipment that implants regions 40 using a photoresist structure, silicon dioxide or silicon nitride hard mask, ion implantation equipment, or any other desired semiconductor implantation equipment. Equipment 76 may perform thermal activation on implant regions 40 after implantation (or at any time prior to formation of metal layers 24). After implants 40 have been formed, equipment 76 may form passivation layer 26 over surface 32 if desired. Layer 26 may be deposited over back side 32 using passivation layer deposition equipment in equipment 76. Passivation layer 26 may include oxide materials, nitride materials, or any other desired materials to protect the back surface 32 of layer 28.

In an FSI arrangement for array 20 (e.g., as shown in FIG. 4), implants 40 may be replaced with extended photodiode regions 60 while performing the processes shown in FIG. 5 (while performing additional FSI fabrication steps thereafter). If desired, deep isolation trenches 50 (as shown in FIG. 3) may be etched or otherwise formed in substrate 28 and may be filled with isolation material after implantation of regions 42, after implantations of regions 40, or prior to implantation of regions 40 and 42. In one suitable arrangement, trenches 50 may be formed prior to thermal activation of regions 40 and 42 to prevent dopant out-diffusion between photodiode regions 36 during the thermal activation.

Figure 6:
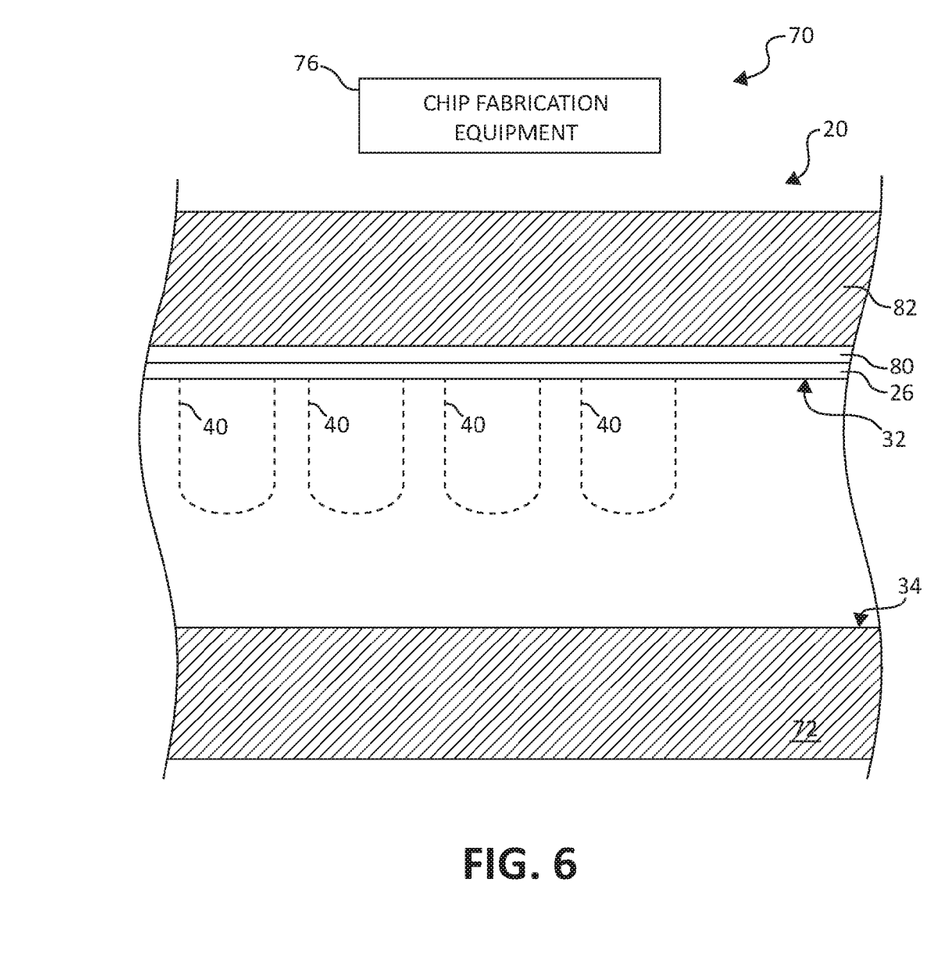

FIG. 6 is a cross-sectional diagram showing how a temporary carrier may be attached to array 20. As shown in FIG. 6, equipment 76 may attach temporary adhesive layer 80 to passivation layer 26. In another suitable arrangement, adhesive layer 80 may be omitted. Equipment 76 may attach temporary carrier structure 82 to adhesive layer 80. Temporary carrier 82 may also be attached to substrate 28 via oxide bonding, for example. Temporary carrier 82 will serve to facilitate flipping of array 20 in manufacturing system 70 (e.g., so that additional photodiode implants may be formed through the front side of substrate 28).

Figure 7:
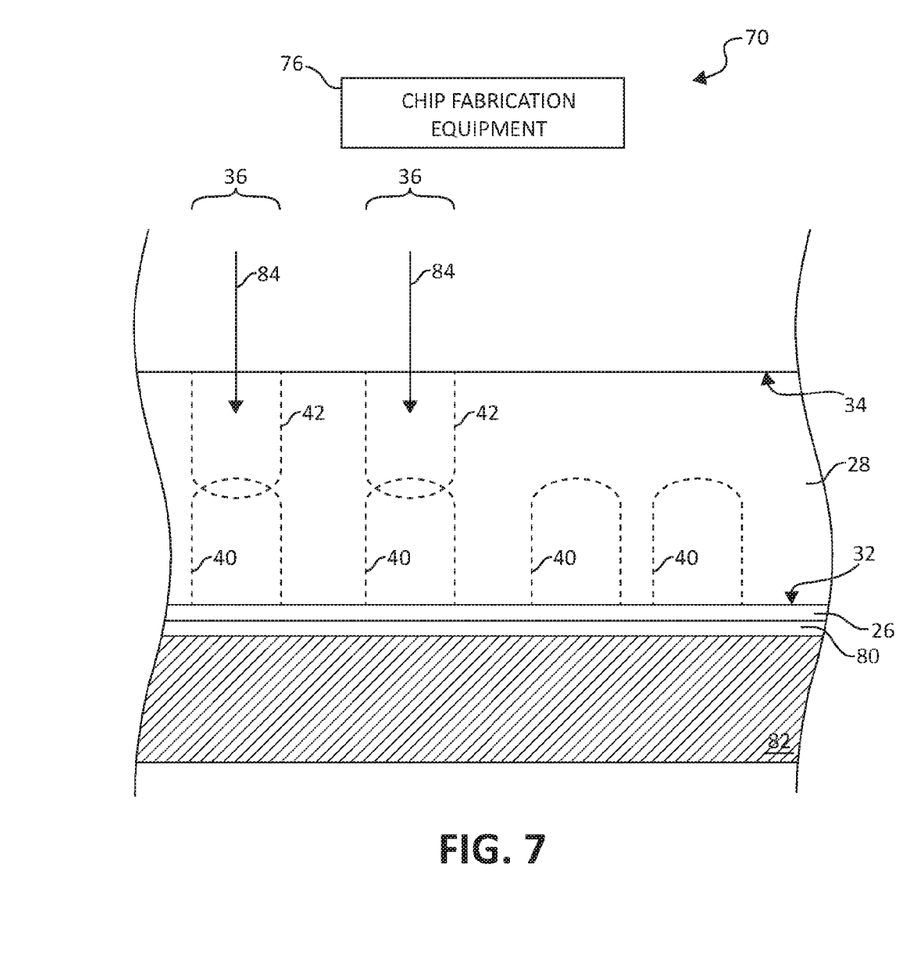

FIG. 7 is a cross-sectional diagram showing how additional photodiode implants may be formed through the front side of substrate 28 to form extended photodiode regions 36. As shown in FIG. 7, array 20 has been flipped (e.g., using fabrication equipment 76 and facilitated by temporary carrier 82) and sacrificial layer 72 has been removed to expose front side 34 of photodiode substrate 28 to fabrication equipment 76. Sacrificial layer 72 may be removed using a grinding process, etching process, or any other desired processes. Fabrication equipment 76 may implant photodiode regions 42 through front side 34 as shown by arrows 84. Equipment 76 may implant regions 42 such that regions 42 overlap with corresponding back side implant regions 40 to form continuous, extended photodiode regions 36. Equipment 76 may implant regions 42 using the same implantation methods and equipment as implant regions 40 if desired. Equipment 76 may perform thermal activation of photodiode regions 42 after implantation.

Figure 8:
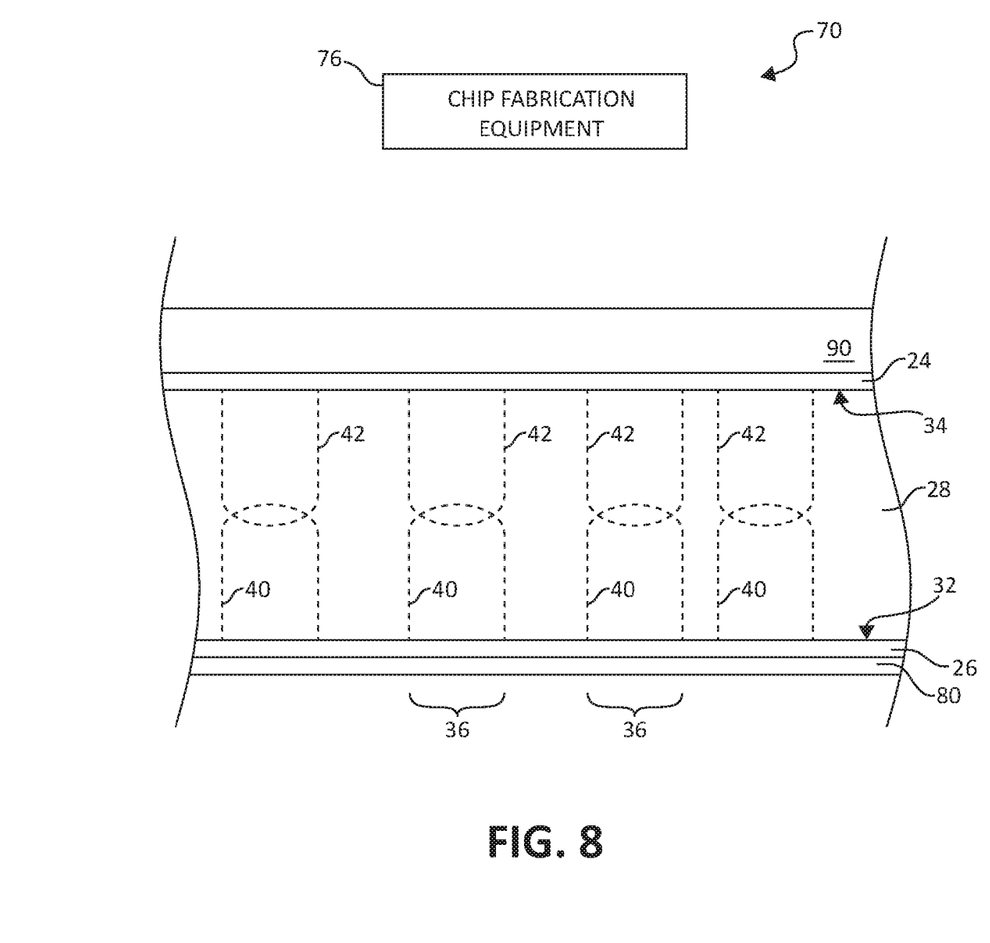

FIG. 8 is a cross-sectional diagram showing array 20 of FIG. 7 after metallization layer 24 has been formed. It should be noted that standard CMOS transistors and logic would also be formed on the front surface 34, under the metallization and dielectric layers 24. The formation of this logic could be pre, post, or during the formation of the photodiode implants 42. As shown in FIG. 8, equipment 76 may couple carrier 90 to metallization layer 24. Carrier 90 may be an integrated circuit wafer (e.g., an application-specific integrated circuit (ASIC) wafer, a field-programmable gate array (FPGA) wafer, or any other desired integrated circuit). After carrier 90 has been attached to layer 24, equipment 76 may remove temporary carrier structure 82. Metallization layer 24 may be formed over front side 34. Metallization layer 24 may include metal interconnect layers and dielectric layers. The metal interconnect layers may couple photodiode regions 36 to other regions in substrate 28, to pixel control circuitry via pixel control lines, to pixel readout circuitry via pixel readout lines, etc. By forming metallization layer 24 only after both sets of photodiode regions 42 and 44 have been implanted and activated, the heat generated by thermal activation of the photodiode regions will not have any impact on the temperature-sensitive components of metallization layer 24. This may allow the depth of the photodiode in each pixel to be effectively extended (e.g., thereby increasing light collection efficiency of the pixels) while eliminating risk of thermal damage to metallization layers 24.

Figure 9:
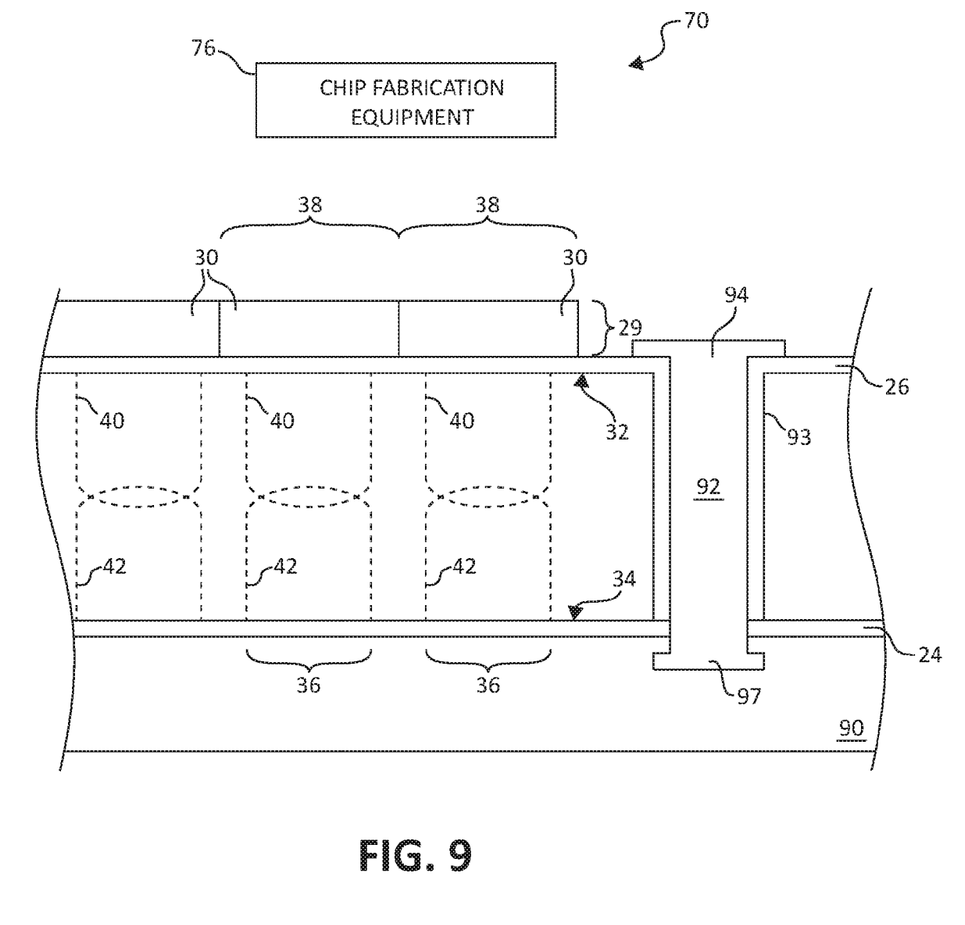

FIG. 9 is a cross-sectional diagram showing an example of array 20 after completion of fabrication. As shown in FIG. 9, equipment 76 may deposit color filter layer 29 over passivation layer 26 at back side 32. Metallization layer 24 may be coupled to carrier 90 (e.g., a carrier such as carrier 22 of FIG. 2 or as shown in FIG. 8). In the example of FIG. 9, carrier 90 is an integrated circuit wafer (e.g., an application-specific integrated circuit (ASIC) wafer, a field-programmable gate array (FPGA) wafer, or any other desired integrated circuit). Fabrication equipment 76 may form through-silicon via structure 91 extending from back surface 32 to front surface 34 of substrate 28. Through-silicon via 91 may be isolated from substrate 28 by passivation layer 93. Passivation layer 93 may be an extension of passivation layer 26 or may be an additional passivation layer.

Via 91 may be filled with conductive material 92 to form a conductive through-silicon via structure. Conductive contact 94 may be coupled to via 92 at side 32. The other side of via 92 may be coupled to metallization layers 24. Metallization layers 24 may be coupled to top metal layers 97 on carrier 90 using via 92 (e.g., in scenarios where carrier 90 is coupled to substrate 28 using fusion bonding). In scenarios where substrate 28 is coupled to carrier 90 using hybrid bonding, metallization layers 24 are already electrically connected to carrier 90 and structure 92 may be omitted. In order to convey signals between carrier 90 and external circuitry, a bond pad opening may be formed in substrate 28 and metal layers 24 to expose top metal layers 97 on carrier 90. Conductive paths may be coupled to the exposed metal layer 97 to convey signals to the external circuitry in this scenario. The example of FIG. 9 is merely illustrative. If desired, array 20 may include more than one via 92. Array 20 may include any desired combination of bond pad openings and through via structures. Array 20 may be implemented using a front side illumination scheme in which filters 30 are formed over metallization layer 24 if desired.

Figure 10:
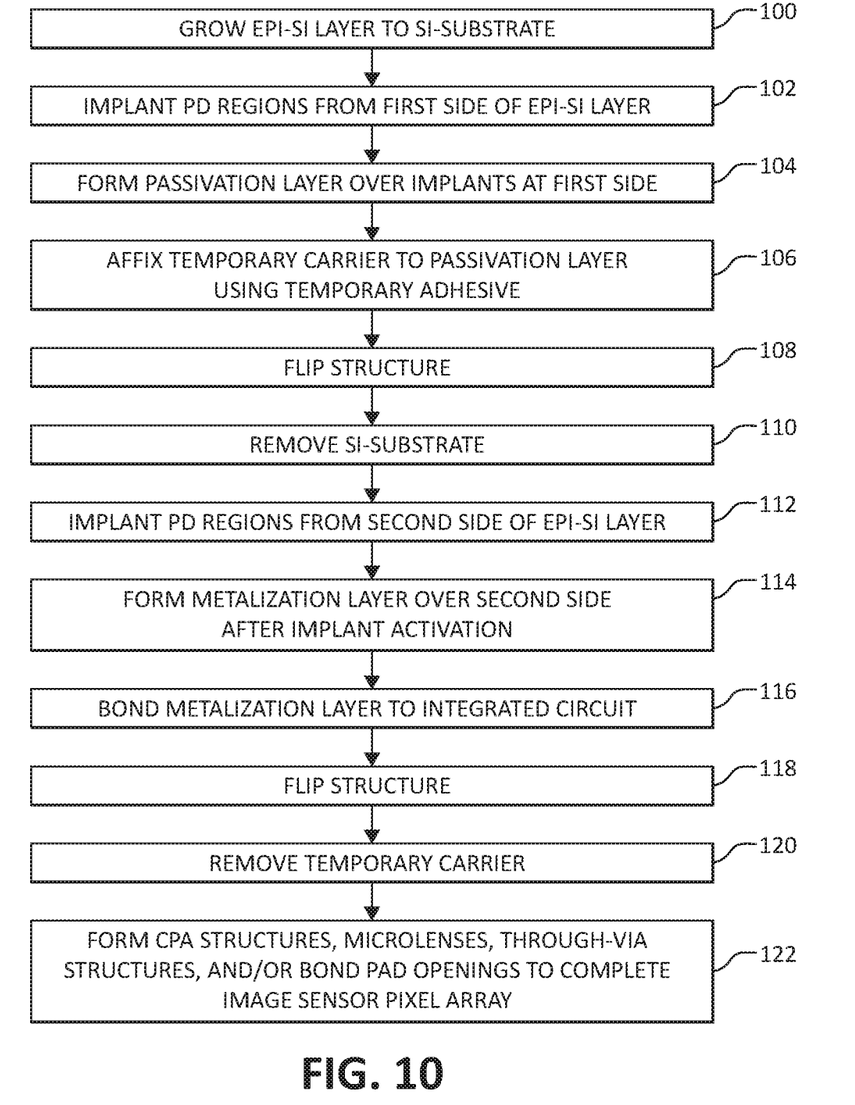
FIG. 10 is a flow chart of illustrative steps that may be performed by chip fabrication equipment for manufacturing an image sensor of the type shown in FIGS. 1-9 in accordance with an embodiment.

FIG. 10 is a flow chart of illustrative steps that may be performed by fabrication equipment 76 to manufacture an image sensor 16 having dual sided photodiode implants of the type shown in FIG. 2. The steps of FIG. 10 describe formation of a BSI image sensor array 20 but may be adapted using suitable processing steps to form a corresponding FSI image sensor array.

At step 100, equipment 76 may grow epi-silicon layer 28 to sacrificial silicon, or SOI substrate 72 (e.g., as shown in FIG. 5).

At step 102, equipment 76 may implant photodiode regions 40 from a first side of substrate 28. For example, equipment 76 may implant photodiode regions 40 through back side 32 (e.g., as shown in FIG. 5). Equipment 76 may implant each region 40 to be formed entirely within a corresponding pixel 38 or may, if desired, implant some of the photodiode regions to form extended regions 60 that extend into adjacent pixel areas on substrate 28 (e.g., to form a corresponding infrared pixel 38IR). Step 102 may also include implantation of isolation regions between the photodiode regions 40.

At step 104, equipment 76 may form passivation layer 26 over the first side of substrate 28. For example, equipment 76 may form layer 26 over back side 32 of substrate 28. This step may be omitted in scenarios where array 20 is an FSI array.

At step 106, equipment 76 may affix or attach temporary carrier 82 to the first side of substrate 28. For example, equipment 76 may attach carrier 82 to passivation layer 26 using adhesive 80 as shown in FIG. 6. For an FSI image sensor, a permanent carrier is attached.

At step 108, the wafer may be flipped over, and at step 110, equipment 76 may remove sacrificial silicon substrate 72 (e.g., as shown in FIG. 5).

At step 112, equipment 76 may implant photodiode regions 42 from a second side of substrate 28 that opposes the first side of substrate 28. For example, equipment 76 may implant photodiode regions 42 through front side 34 (e.g., as shown in FIG. 7). Equipment 76 may implant each region 42 to be formed entirely within a corresponding pixel 38 or may, if desired, implant some of the photodiode regions to form extended regions 60 that extend into adjacent pixel areas on substrate 28 (e.g., to form a corresponding infrared pixel 38IR). Step 112 may also include implantation of isolation regions between the photodiode regions 40.

At step 114, equipment 76 may form metallization layer 24 over the second side of substrate 28 after the photodiode regions at both sides of substrate 28 have been thermally activated. For example, equipment 76 may form metallization layer 24 over front side 34 of substrate 28 as shown in FIG. 8. Equipment 76 may thermally activate regions 40 while processing step 102 or at any other time between processing steps 102 and step 114. Similarly, equipment 76 may thermally activate regions 42 while processing step 112 or after processing step 112 and prior to processing step 114. This may ensure that the heat required for thermal activation of both sides of photodiode regions does not damage the pixel metallization layers. In scenarios where array 20 is an FSI image sensor array, passivation layer 26 may be formed over metallization layer 24. Deep isolation trench structures 50 (FIG. 3) may be formed in substrate 28 at any desired time in the flow chart of FIG. 10, but preferably prior to processing step 114.

At step 116, equipment 76 may bond metallization layer 76 to a carrier wafer or an integrated circuit structure. For example, equipment 76 may bond layer 24 to ASIC 90 as shown in FIG. 9.

At step 118, equipment 76 may flip the array bonded to the carrier wafer or integrated circuit structure and, at step 120, equipment 76 may remove the temporary carrier structure 82. For example, equipment 76 may remove carrier 82 and corresponding adhesive 80 (e.g., using a silicon grinding process, a mechanical grinding process, a chemical etching process, or any other desired process).

At step 122, equipment 76 may form any desired color filter structures 29 over the array. For example, equipment 76 may form color filter layer 29 over passivation layer 26 at back side 32 of the array (as shown in FIG. 9). In scenarios where array 20 is a FSI array, layer 29 may be formed over passivation layer 26 at front side 34 of the array following step 114 (e.g., as shown in FIG. 4). Microlenses may be formed over the color filter elements if desired. Through-silicon via structures, bond pad openings, or any other desired interconnect structures may be formed on array 20.

The example of FIG. 10 is merely illustrative. In general, any desired FSI or BSI fabrication steps may be performed in any desired order to form array 20 such that metallization layer 114 is formed after activation of the dual sided photodiode implants. In scenarios where array 20 is an FSI photodiode array, steps 116, 118, and 120 may be omitted if desired.

Figure 11:
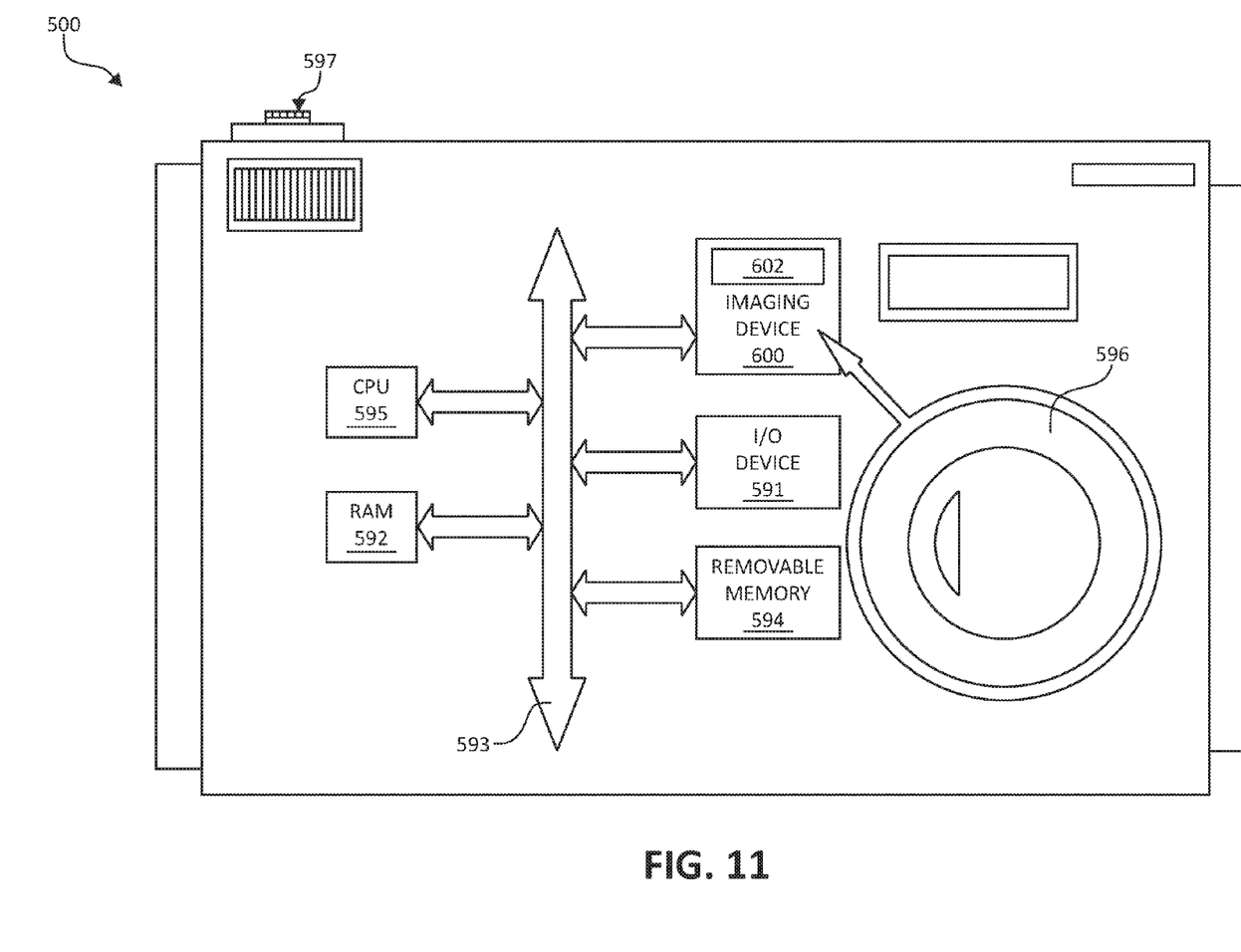
FIG. 11 is a block diagram of a processor system employing at least some of the embodiments of the image pixel array in FIGS. 1-9 in accordance with an embodiment.

FIG. 11 is a block diagram of a processor system employing at least some of the embodiments of the image pixel array 20 in FIGS. 1-9. Device 600 may comprise the elements of device 10 (FIG. 1) or any relevant subset of the elements. Device 600 may include an image sensor 602 such as sensor 16 of FIG. 1. Processor system 500 is exemplary of a system having digital circuits that could include imaging device 600. Without being limiting, such a system could include a computer system, still or video camera system, scanner, machine vision, vehicle navigation, video phone, surveillance system, auto focus system, star tracker system, motion detection system, image stabilization system, and other systems employing an imaging device.

Processor system 500, which may be a digital still or video camera system, may include a lens or multiple lenses indicated by lens 596 for focusing an image onto an image sensor, image sensor array, or multiple image sensor arrays such as image sensor 16 (FIG. 1) when shutter release button 597 is pressed. Processor system 500 may include a central processing unit such as central processing unit (CPU) 595. CPU 595 may be a microprocessor that controls camera functions and one or more image flow functions and communicates with one or more input/output (I/O) devices 591 over a bus such as bus 593. Imaging device 600 may also communicate with CPU 595 over bus 593. System 500 may include random access memory (RAM) 592 and removable memory 594. Removable memory 594 may include flash memory that communicates with CPU 595 over bus 593. Imaging device 600 may be combined with CPU 595, with or without memory storage, on a single integrated circuit or on a different chip. Although bus 593 is illustrated as a single bus, it may be one or more buses or bridges or other communication paths used to interconnect the system components.

Various embodiments have been described illustrating image sensor having an array of image sensor pixels that includes photodiode regions implanted through opposing sides of a semiconductor substrate.

The array of image sensor pixels may include a semiconductor substrate having opposing first and second sides. A first photodiode region may be implanted in the semiconductor substrate through the first side. A second photodiode region may be implanted in the semiconductor substrate through the second side. The second photodiode region may be implanted to overlap with the first photodiode region in the semiconductor substrate. The first and second implanted photodiode regions may form a continuous photodiode region that extends from the first side to the second side of the substrate.

As an example, the first photodiode region may include a first n-type doped region and the second photodiode region may include a second n-type doped region. The first and second n-type doped regions may form a continuous n-type doped region that extends from the first side to the second side of the semiconductor substrate. The continuous n-type doped region may have a total depth equal to a sum of the individual depths of the first and second doped implant regions. As an example, the first and second doped regions may each have a depth of less than or equal to three microns. Additional continuous n-type doped regions that extend from the first side to the second side may be formed in the semiconductor substrate. P-type doped isolation structures may be implanted in the semiconductor substrate between the continuous n-type doped regions. In another suitable arrangement, deep trench isolation structures may be formed between the regions.

If desired, the first n-type doped region may have a first lateral area at the first side of the semiconductor substrate whereas the second n-type doped region has a second lateral area at the second side of the semiconductor substrate that is greater than the first lateral area. An array of color filter elements may be formed over the first side of the semiconductor substrate and may include an infrared color filter element. The infrared color filter element may be formed over the first n-type doped region at the first side of the semiconductor substrate if desired.

The first and second photodiode regions may belong to a single image pixel on the array and may generate charge in response to image light. The pixel may generate an image signal in response to the generated charge. A pixel readout line may convey the image signal from the image pixel to pixel readout circuitry. The pixel readout line may be formed as a portion of metallization layers formed over the substrate. The metallization layers may be formed over the first or second side of the substrate.

A method of manufacturing such an image sensor pixel using chip fabrication may be provided. The chip fabrication equipment may thermally activate the first and second photodiode regions after implantation. The metallization layers may be formed over the semiconductor substrate after the photodiode regions have been thermally activated.

The foregoing is merely illustrative of the principles of this invention and various modifications can be made by those skilled in the art without departing from the scope and spirit of the invention. The foregoing embodiments may be implemented individually or in any combination.

What is claimed is:

1. An array of image sensor pixels, comprising:
   a semiconductor substrate having opposing first and second sides;
   a first photodiode region implanted in the semiconductor substrate through the first side, wherein the first photodiode region comprises a first n-type doped region; and
   a second photodiode region implanted in the semiconductor substrate through the second side, wherein the second photodiode region overlaps with the first photodiode region in the semiconductor substrate, wherein the second photodiode region comprises a second n-type doped region, and wherein the first n-type doped region and the second n-type doped region form a continuous n-type doped region that extends to within less than or equal to 0.5 microns of the first side and to within less than or equal to 0.5 microns of the second side of the semiconductor substrate.

2. The array defined in claim 1, further comprising:
   an additional continuous n-type doped region that extends to within less than or equal to 0.5 microns of the first side and to within less than or equal to 0.5 microns of the second side of the semiconductor substrate; and
   a p-type doped isolation structure implanted in the semiconductor substrate between the continuous n-type doped region and the additional continuous n-type doped region.

3. The array defined in claim 1, further comprising:
   an additional continuous n-type doped region that extends to within 0.5 microns from the first side and to within 0.5 microns of the second side of the semiconductor substrate; and
   deep trench isolation structures that extend from at least a given one of the first and second sides of the semiconductor substrate and that isolate the continuous n-type doped region from other n-type doped regions in the array.

4. The array defined in claim 1, wherein the first n-type doped region has a first lateral area at the first side of the semiconductor substrate and the second n-type doped region has a second lateral area at the second side of the semiconductor substrate that is greater than the first lateral area.

5. The array defined in claim 4, further comprising:
   an array of color filter elements formed over the first side of the semiconductor substrate, wherein the array of color filter elements comprise a first set of color filter elements that transmit light of a given color and a second set of color filter elements that transmit infrared light, wherein a given color filter of the second set of color filter elements is formed over the first n-type doped region at the first side of the semiconductor substrate.

6. The array defined in claim 1, wherein the continuous n-type doped region is configured to generate charge in response to image light and is formed as part of an image sensor pixel that generates an image signal based on the generated charge, the array further comprising:
   a pixel readout line coupled to the continuous n-type doped region, wherein the pixel readout line is configured to convey the image signal to pixel readout circuitry.

7. The array defined in claim 6, wherein the continuous n-type doped region is configured to generate the charge in response to image light received through the first side of the semiconductor substrate, the array further comprising:
   metallization layers formed over the first side of the semiconductor substrate, wherein the metallization layers include the pixel readout line.

8. The array defined in claim 6, wherein the continuous n-type doped region is configured to generate the charge in response to image light received through the first side of the semiconductor substrate, the array further comprising:
   metallization layers formed over the second side of the semiconductor substrate, wherein the metallization layers include the pixel readout line.

9. The array defined in claim 1, wherein the first n-type doped region has a first depth extending from the first side of the semiconductor substrate, the second n-type doped region has a second depth extending from the second side of the semiconductor substrate, and the continuous n-type doped region has a depth that is equal to a sum of the first and second depths.

10. The array defined in claim 9, wherein the first and second depths are less than or equal to three microns.

11. A method of manufacturing an image sensor pixel array using chip fabrication equipment, the method comprising:
    implanting a first photodiode region through a first side of a semiconductor substrate;
    implanting a second photodiode region through a second side of the semiconductor substrate so that the second photodiode region overlaps with the first photodiode region in the semiconductor substrate to form a continuous photodiode region that is only n-type doped, wherein the second side opposes the first side;

thermally activating the first and second photodiode regions; and after the first and second photodiode regions have been thermally activated, forming metallization layers over the semiconductor substrate.

12. The method defined in claim 11, wherein implanting the second photodiode region comprises:

implanting the second photodiode region so that the continuous photodiode region extends to within less than or equal to 0.5 microns of the first side to within less than or equal to 0.5 microns of the second side of the semiconductor substrate.

13. The method defined in claim 11, further comprising:

after implanting the first photodiode region, coupling a temporary carrier to the second side of the semiconductor substrate;

flipping the image sensor pixel array using the temporary carrier; and implanting the second photodiode region after the image sensor pixel array has been flipped.

14. The method defined in claim 11, wherein the first and second photodiode regions form part of an image sensor pixel in the image sensor pixel array, wherein the image sensor pixel generates an image signal based on charge generated by the first and second photodiode regions, and the metallization layers comprise a pixel readout line that conveys the image signal generated by the image sensor pixel to pixel readout circuitry.

15. The method defined in claim 11, further comprising:

implanting a third photodiode region through the first side of a semiconductor substrate;

implanting a fourth photodiode region through the second side of the semiconductor substrate; and forming isolation structures in the semiconductor substrate that are interposed between the first and third photodiode regions and that are interposed between the second and fourth photodiode regions, wherein the isolation structures are selected from the group of isolation structures consisting of: isolation trench structures and isolation implant regions.

16. The method defined in claim 15, further comprising:

thermally activating the first, second, third, and fourth photodiode regions after forming the deep isolation trench structure; and forming the metallization layers over the semiconductor substrate after the first, second, third, and fourth photodiode regions have been thermally activated.

17. A system, comprising:

a central processing unit;

memory;

input-output circuitry;

a lens; and an array of image pixels, wherein the array comprises:

a semiconductor substrate having opposing first and second sides;

a first set of n-type doped regions implanted in the semiconductor substrate through the first side;

a second set of n-type doped regions implanted in the semiconductor substrate through the second side, wherein each n-type doped region in the first set overlaps with a respective n-type doped region in the second set to form a plurality of continuous n-type doped regions that extend from the first side to the second side of the semiconductor substrate, wherein at least one of the plurality of continuous n-type doped regions is only n-type doped, and wherein the plurality of continuous n-type doped regions generates charge in response to image light received from the lens.

18. The system defined in claim 17, wherein each continuous n-type doped region in the plurality of continuous n-type doped regions is formed in a respective image pixel of the array of image pixels.

* * * * *